(12) United States Patent
Chen et al.

(10) Patent No.: US 7,785,927 B2
(45) Date of Patent: Aug. 31, 2010

(54) MULTI-DIE WAFER LEVEL PACKAGING

(75) Inventors: Chen-Shien Chen, Zhubei (TW); Kai-Ming Ching, Jhudong Township (TW); Chih-Hua Chen, Taipei (TW); Chen-Cheng Kuo, Chu-Pei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 4 days.

(21) Appl. No.: 12/392,918

(22) Filed: Feb. 25, 2009

(65) Prior Publication Data

US 2009/0155957 A1 Jun. 18, 2009

Related U.S. Application Data

(63) Continuation of application No. 11/756,347, filed on May 31, 2007, now Pat. No. 7,514,797.

(51) Int. Cl.
*H01L 21/98* (2006.01)
(52) U.S. Cl. .................. 438/109; 438/117; 438/613; 257/E21.705
(58) Field of Classification Search .......... 257/E21.705; 438/109, 108, 117, 613
See application file for complete search history.

(56) References Cited

U.S. PATENT DOCUMENTS

| 5,191,405 | A | 3/1993 | Tomita et al. |
| 5,399,898 | A | 3/1995 | Rostoker |
| 6,122,187 | A | 9/2000 | Ahn et al. |
| 2004/0238936 | A1 | 12/2004 | Rumer et al. |
| 2006/0076661 | A1 | 4/2006 | Savastiouk et al. |
| 2006/0273455 | A1 | 12/2006 | Williams et al. |
| 2006/0278979 | A1 | 12/2006 | Rangel |
| 2007/0001266 | A1 | 1/2007 | Arana et al. |

*Primary Examiner*—Roy K Potter
(74) *Attorney, Agent, or Firm*—Slater & Matsil, L.L.P.

(57) ABSTRACT

A semiconductor die package is provided. The semiconductor die package includes a plurality of dies arranged in a stacked configuration. Through-silicon vias are formed in the lower or intermediate dies to allow electrical connections to dies stacked above. The lower die is positioned face up and has redistribution lines electrically coupling underlying semiconductor components to the through-silicon vias. The dies stacked above the lower die may be oriented face up such that the contact pads are facing away from the lower die or flipped such that the contact pads are facing the lower die. The stacked dies may be electrically coupled to the redistribution lines via wire bonding or solder balls. Additionally, the lower die may have another set of redistribution lines on an opposing side from the stacked dies to reroute the vias to a different pin-out configuration.

20 Claims, 6 Drawing Sheets

FIG. 13

MULTI-DIE WAFER LEVEL PACKAGING

This application is a continuation of patent application Ser. No. 11/756,347, entitled "Multi-Die Wafer Level Packaging," filed on May 31, 2007 now U.S. Pat. No. 7,514,797, which application is incorporated herein by reference.

TECHNICAL FIELD

This invention relates generally to integrated circuits and, more particularly, to multi-die wafer level packaging.

BACKGROUND

Since the invention of the integrated circuit, the semiconductor industry has experienced continued rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D integrated circuit formation, there are physical limits to the density that can be achieved in two dimensions. One of these limits is the minimum size needed to make these components. Also, when more devices are put into one chip, more complex designs are required.

An additional limit comes from the significant increase in the number and length of interconnections between devices as the number of devices increases. When the number and length of interconnections increase, both circuit RC delay and power consumption increase.

In an attempt to further increase circuit density, three-dimensional (3D) integrated circuits (ICs) have been investigated. In a typical formation process of a 3D IC, two dies are bonded together and electrical connections are formed between each die and contact pads on a substrate. For example, one attempt involved bonding two dies on top of each other. The stacked dies were then bonded to a carrier substrate and wire bonds electrically coupled contact pads on each die to contact pads on the carrier substrate.

Advances have also been made in wafer-level packaging. Generally, wafer-level packaging involves performing back-end-of-line processing at the wafer level as opposed to performing this processing after the wafer has been diced. In particular, wafer-level packaging may include forming contact structures, encapsulating or back-side protection, grinding, and the like at the wafer level. It has been found that performing these functions at the wafer level may decrease costs. Wafer-level packaging may also result in thinner packages.

Unfortunately, however, most of the advancements that have been made in wafer-level packaging have been related to single die and relied on front-side ball solder ball mounts. While a system in a package configuration allowed for multiple dies package together, a separate substrate is required. This package creates a larger, thicker form factor and may also result in higher RC loss.

Accordingly, there is a need for a stacked die, wafer-level package.

SUMMARY OF THE INVENTION

These and other problems are generally reduced, solved or circumvented, and technical advantages are generally achieved, by embodiments of the present invention, which provides a multi-die wafer level package.

In accordance with an embodiment of the present invention, a semiconductor package comprising two dies is provided. A first die has a first substrate having a first set of redistribution lines electrically coupled to one or more semiconductor components on a first side of the first die. The first die also has conductive vias extending through the first die and are electrically coupled to the redistribution lines. The second die is attached to the first die such that the first side of the first die faces the second die. Contact pads on the second die may be electrically coupled to the redistribution lines using, for example wire bonds or solder balls. Furthermore, the first die may have a second set of redistribution lines on an opposing side from the first side, the second set of redistribution lines being electrically coupled to respective ones of the conductive vias.

In accordance with another embodiment of the present invention, a semiconductor package is provided. The semiconductor package comprises a first die and a second die, wherein each of the first die and the second die have a device side and a back side. The second die is attached to the first die such that the device side of the first die faces the second die. A first set of redistribution lines are interposed between the first die and the second die and are electrically coupled to conductive vias extending through the first die. Conductive elements, such as wire bonds or solder balls, electrically couple contacts on the second die to respective ones of the first set of redistribution lines. A second set of redistribution lines may be formed on an opposing side of the first die from the first set of redistribution lines, the second set of redistribution lines being electrically coupled to respective ones of the conductive vias.

In accordance with yet another embodiment of the present invention, a semiconductor package is provided. The semiconductor package includes a first die having a first substrate, wherein the first substrate has semiconductor structures formed on a first surface. A protective layer is formed on a second opposing surface of the first substrate, and through-silicon vias are formed through the first substrate and the protective layer. First redistribution lines formed on the first side electrically couple the semiconductor structures to the through-silicon vias. A second die may be stacked on the first die with contact pads in either a face down or face up configuration and may be electrically coupled to the first redistribution lines with wire bonding or soldering. Furthermore, a second set of redistribution lines may be formed on an opposing side of the first die from the first redistribution lines, the second redistribution lines being electrically coupled to respective ones of the through-silicon vias.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The intermediate stages of a novel method for forming a three-dimensional integrated circuit are illustrated in FIGS. 1 through 9. Throughout the various views and illustrative embodiments of the present invention, like reference numbers are used to designate like elements.

Figure 1:
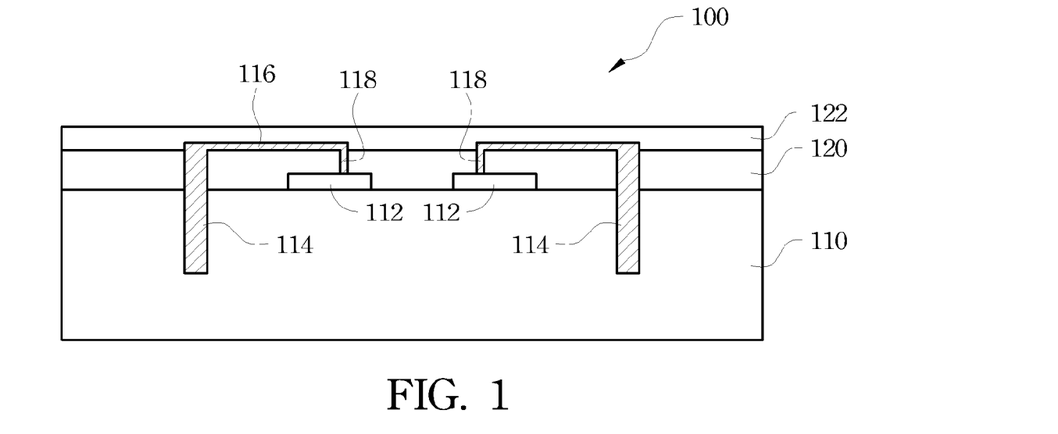
FIGS. 1-6 illustrate intermediate stages in forming a stacked die package in accordance with an embodiment of the present invention.

Referring first to FIG. 1, a first die of a wafer 100 comprising a semiconductor substrate 110 having electrical circuitry 112 formed thereon is shown. The semiconductor substrate 110 may comprise, for example, bulk silicon, doped or undoped, or an active layer of a semiconductor-on-insulator (SOI) substrate. Generally, an SOI comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

The electrical circuitry 112 formed on the semiconductor substrate 110 may be any type of circuitry suitable for a particular application. In an embodiment, the circuitry includes electrical devices formed on the substrate with one or more dielectric layers overlying the electrical devices. Metal layers may be formed between dielectric layers to route electrical signals between the electrical devices. Electrical devices may also be formed in one or more dielectric layers.

For example, the electrical circuitry 112 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

Also shown in FIG. 1 are through-silicon vias 114 and redistribution lines 116. The redistribution lines 116 electrically couple the electrical circuitry 112 (via contact plugs 118) to the through-silicon vias 114. The redistribution lines 116 may be formed using common methods for forming interconnect lines in integrated circuits. For example, in an embodiment the redistribution lines 116 are fabricated by forming a layer of copper and a layer of nickel over the layer of copper through sputter, chemical vapor deposition, electrical plating, pattern electrical plating, or electroless plating, and then etching the undesired portions to form the redistribution lines 116. Other materials, such as aluminum, tungsten, titanium, combinations thereof, or the like may be used. In an embodiment, the redistribution lines 116 have a thickness between about 0.5 µm and about 30 µm. Other materials and process, such as a well-known damascene process, could alternatively be used to form the redistribution lines 116.

The through-silicon vias 114 may be formed by any appropriate method. For example, in an embodiment the through-silicon vias are formed after the electrical circuitry 112 is formed. In this embodiment, openings are formed through interlayer dielectric 120 and partially through the semiconductor substrate 110. The openings may be formed, for example, by one or more etching processes, milling, laser techniques, or the like. The openings are lined with diffusion barrier layers, adhesion layers, isolation layer, or the like, and filled with a conductive material. Preferably, diffusion barrier layers (not shown), comprise one or more layers of TaN, Ta, TiN, Ti, CoW, or the like, and the conductive material comprises copper, tungsten, aluminum, silver, and combinations thereof, or the like, thereby forming the through-silicon vias 114. In an embodiment, the through-silicon vias 114 have a diffusion barrier layer of TaN and are filled with copper formed by an electro-chemical plating process in which a seed layer is deposited to aid in the formation of the conductive fill material.

In another embodiment, the through-silicon vias 114 are formed prior to forming the electrical circuitry 112. In this embodiment, the through-silicon vias 114 are formed and filled with a dielectric material. After grinding the backside of the die, the dielectric material is removed via an etching process and replaced with a conductive material, such as copper. Other methods and materials may be used.

The redistribution lines 116 are preferably covered with a passivation layer 122. The passivation layer 122 preferably comprises a high-heat resistant material. It should be noted that the passivation layer 122 is illustrated as a single layer for illustrative purposes only and may comprise a plurality of layers of different materials. Suitable materials that may be used to form the passivation layer 122 include polyimide, BCB, SOG, $SiO_x$, $SiN_x$, $SiON_x$, other inorganic materials, other silicon-related materials, other high thermal stable polymers, and the like.

Figure 2:
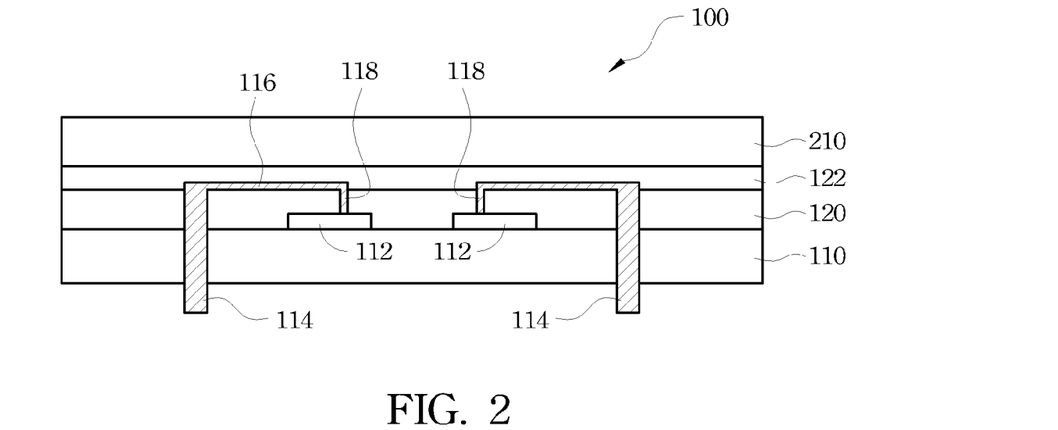

FIG. 2 illustrates the portion of the wafer 100 after a carrier wafer 210 has been attached in accordance with an embodiment of the present invention. Generally, the carrier wafer 210 provides temporary mechanical and structural support to the wafer 100 during subsequent processing steps. In this manner, damage to the semiconductor substrate 110 is reduced or prevented.

The carrier wafer 210 may comprise, for example, glass, silicon oxide, aluminum oxide, and the like. In an embodiment, an adhesive (not shown) is used to glue the carrier wafer 210 to a top surface of the passivation layer 122. The adhesive may be any suitable adhesive, such as an ultraviolet (UV) glue, which loses its adhesive property when exposed to UV lights. The preferred thickness of the carrier wafer 210 is preferably greater than about 12 mils.

Also illustrated in FIG. 2 is the exposing of the through-silicon vias 114. In a preferred embodiment, the through-silicon vias 114 are exposed using a combination of planarizing and etching steps. Initially, a planarizing process, such as grinding or a chemical mechanical polishing (CMP), may be performed to initially expose the through-silicon vias 114. Thereafter, an etching process may be performed to recess the semiconductor substrate 110, thereby leaving the through-silicon vias 114 protruding from the underside of the semiconductor substrate 110 as illustrated in FIG. 2. In an embodiment in which the through-silicon vias 114 are formed of copper, the semiconductor substrate 110 may be recessed by performing a dry etch process using $HBr/O_2$, $HBr/Cl_2/O_2$, $SF_6/CL_2$, $SF_6$ plasma, or the like. Preferably, about 5 μm to about 30 μm of the through-silicon vias 114 are exposed.

Figure 3:
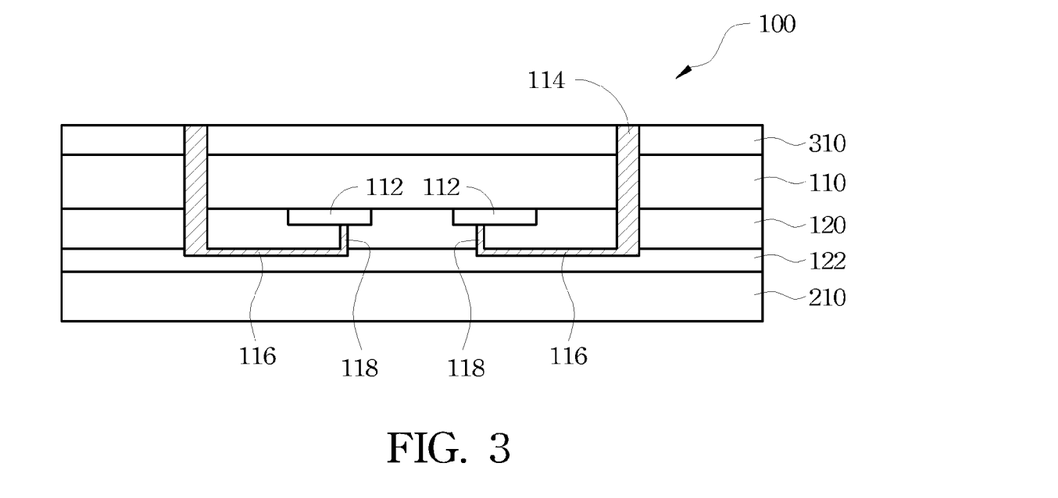

FIG. 3 illustrates the wafer 100 after a protective coating 310 has been applied in accordance with an embodiment of the present invention. In a preferred embodiment, the protective coating 310 is an epoxy, gel, silicon rubber, or the like, and may be dispensed by, for example, spin-coating or printing.

The protective coating 310 is preferably formed having a thickness sufficient to cover the exposed through-silicon vias 114. In this embodiment, a second planarizing process, such as grinding or CMP, is performed such that a substantially planar surface is formed and the through-silicon vias 114 are exposed as illustrated in FIG. 3.

Figure 4:
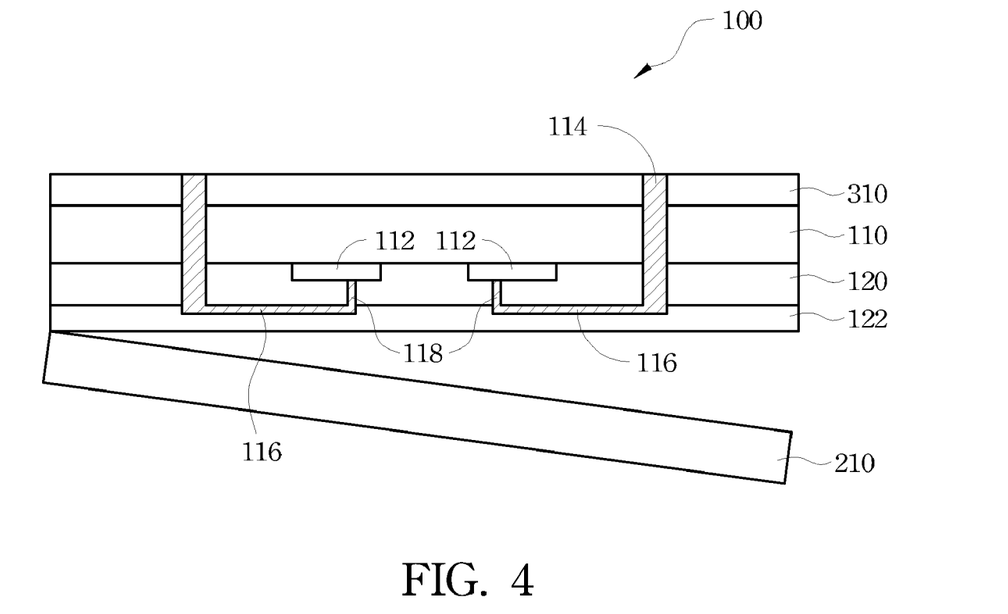

FIG. 4 illustrates the wafer 100 after the carrier wafer 210 is removed in accordance with an embodiment of the present invention. In an embodiment in which a UV glue is used to attach the carrier wafer 210 to the wafer 100 as discussed above, the UV glue is exposed to UV light, thereby causing the UV glue, for example, to become non-adhesive. Thereafter, the carrier wafer 210 may be easily detached. Other types of adhesive may be used, which may be released using, for example, thermal, solvent/plasma stripper, laser, or the like techniques.

Figure 5:
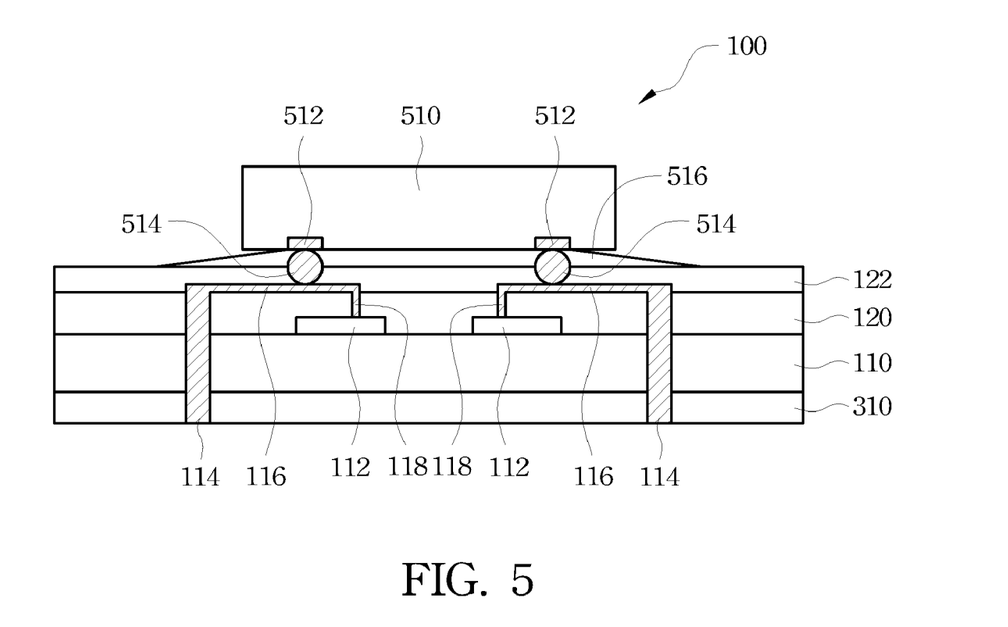

FIG. 5 illustrates the wafer 100 after a second die 510 has been attached in accordance with an embodiment of the present invention. It should be noted that the second die 510 is illustrated as being smaller than the first die for illustrative purposes only, and that the sizes of the first die and the second die 510 may vary such that the first die may be smaller or larger or the same size as the second die 510.

The second die 510 is preferably electrically coupled to the first die in a flip-chip configuration such that contact pads 512 face the first die. The contact pads 512 are electrically coupled to the redistribution lines 116 via solder balls 514, which may be formed by a high-lead, eutectic, lead free solder, Cu bump, Cu/Sn, or the like.

An optional underfill material 516 may be injected or otherwise formed in the space between the second die 510 and the passivation layer 122. The underfill material 516 may, for example, comprise a liquid epoxy that is dispensed between the second die 510 and the passivation layer 122, and then cured to harden. This underfill material 516 is used, among other things, to prevent cracks from being formed in the solder balls 514, wherein cracks are typically caused by thermal stresses.

Alternatively, either a deformable gel or silicon rubber could be formed between the second die 510 and the passivation layer 122 in order to help prevent cracks from occurring within the solder balls 514. This gel or silicon rubber may be formed by injecting or otherwise placing the gel or rubber between the second die 510 and the passivation layer 122. The deformable gel or silicon rubber can provide greater stress relief.

One of ordinary skill in the art will realize that while a flip-chip configuration is discussed herein, other configurations may be used as well. For example, wire bonding may be used to electrically couple contact pads of the second die laying face up to the redistribution lines 116, as discussed below with reference to FIG. 7.

Figure 6:
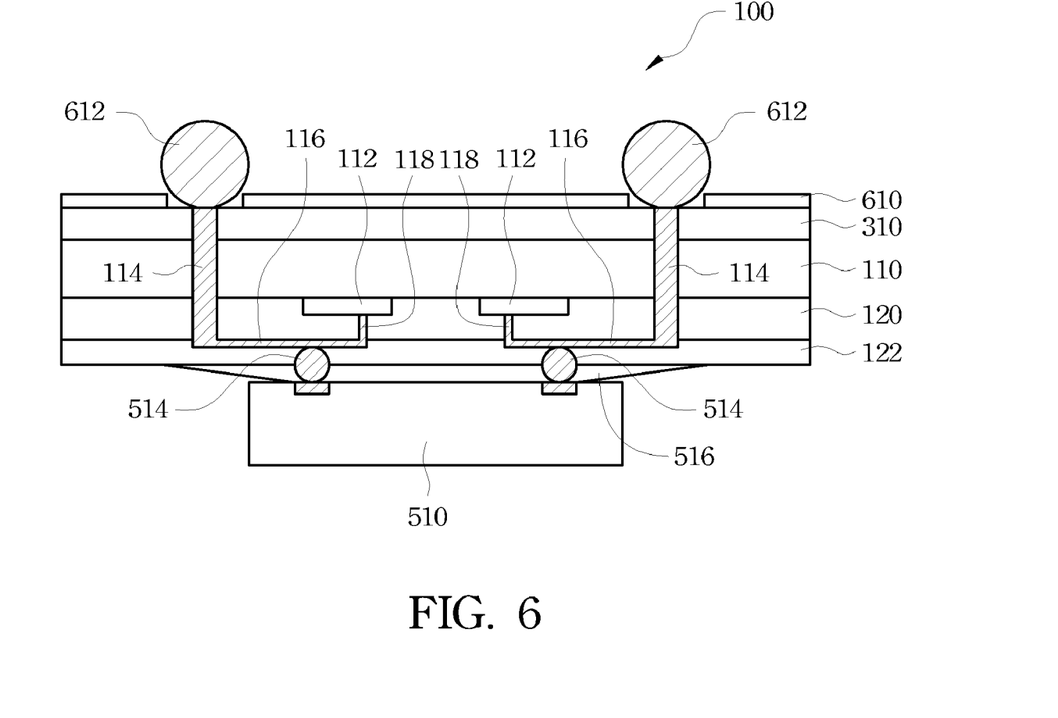

Thereafter, a solder mask 610 and second solder balls 612 may be formed in accordance with an embodiment of the present invention as illustrated in FIG. 6. The solder mask 610 may be formed by depositing and patterning a solder mask material to expose contact regions of the underlying redistribution lines 116. Thereafter, the second solder balls 612 comprising a high-lead, eutectic, or lead free solder, or the like may be formed. The processes of forming and patterning a solder mask and forming solder balls are well-known in the art and, thus, are not repeated herein.

One of ordinary skill in the art will realize that the second solder balls 612 may be formed by other methods. For example, an under-bump metallization (UBM) may be deposited over the protective coating 310 and second solder balls 612 formed thereon by, for example, evaporation, electroplating, printing, jetting, stud bumping, direct placement, or the like. Furthermore, the second solder balls 612 may be formed directly on the through-silicon vias 114.

It should be noted that the redistribution lines 116 may comprise lines electrically coupling semiconductor structures formed on the first semiconductor die 110, such as electrical circuitry 112, to the through-silicon vias 114 (and to the second solder balls 612) or lines electrically coupling semiconductor structures (not shown) formed on the second semiconductor die 510 to the through-silicon vias 114 (and to the second solder balls 612). Additionally, semiconductor structures on both the first semiconductor die and the second semiconductor die 510 may be electrically coupled to the same redistribution line.

Thereafter, other back-end-of-line processing techniques suitable for the particular application may be performed. For example, an encapsulant may be formed, a singulation process may be performed to singulate individual stacked-die packages, and the like.

Figure 7:
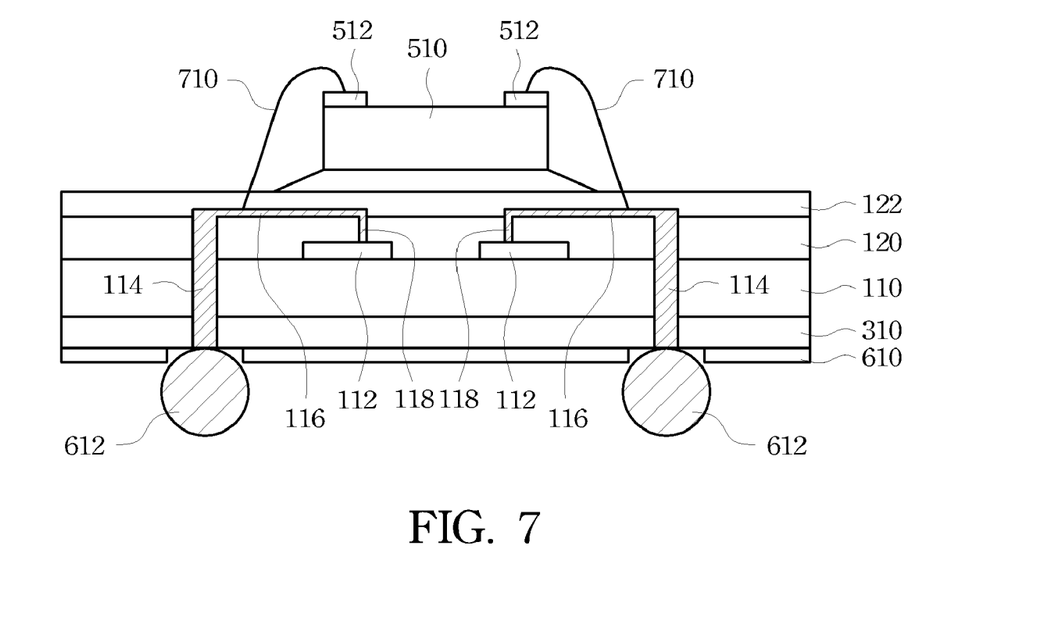
FIG. 7 illustrates another embodiment of a stacked die package in accordance with an embodiment of the present invention.

It should also be noted that the embodiment discussed above illustrates an embodiment in which the second die 510 is electrically coupled to the first die 130 using solder balls 514 for illustrative purposes only and that other techniques may be used. For example, FIG. 7 illustrates an embodiment in which the second die 510 is electrically coupled to the redistribution lines 116 using wire bonds 710 as is known in the art. In this embodiment, the second die 510 is attached to the first die such that the contact pads 512 on the second die 510 face away from the first die. Wire bonds 710 extend over the side of the first die and electrically couple the contact pads 512 to respective ones of the first set of redistribution lines 116.

Figure 8:
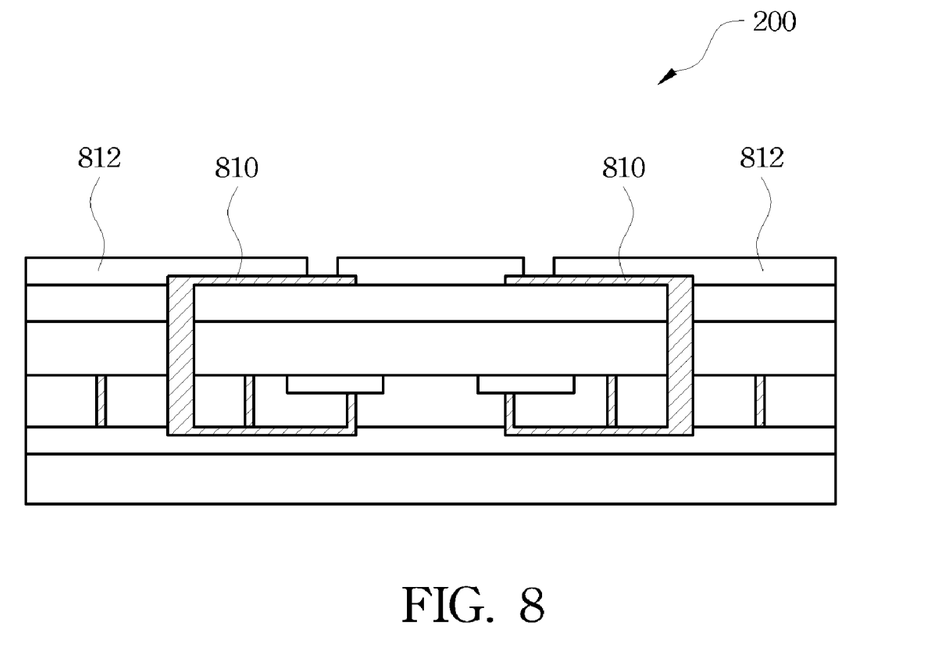
FIGS. 8-10 illustrate intermediate stages in forming a stacked die package in accordance with an embodiment of the present invention.
Figure 9:
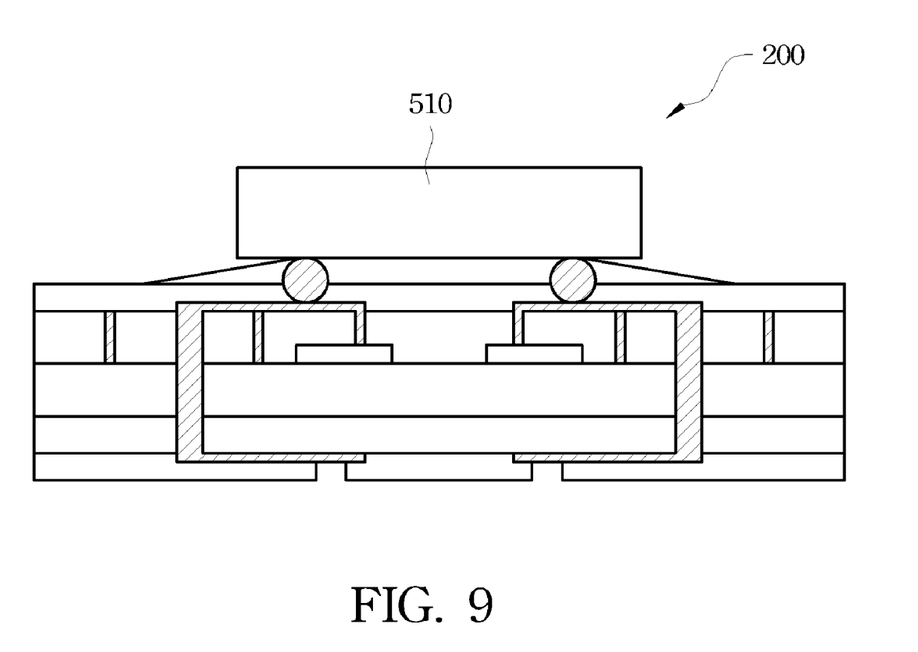
Figure 10:
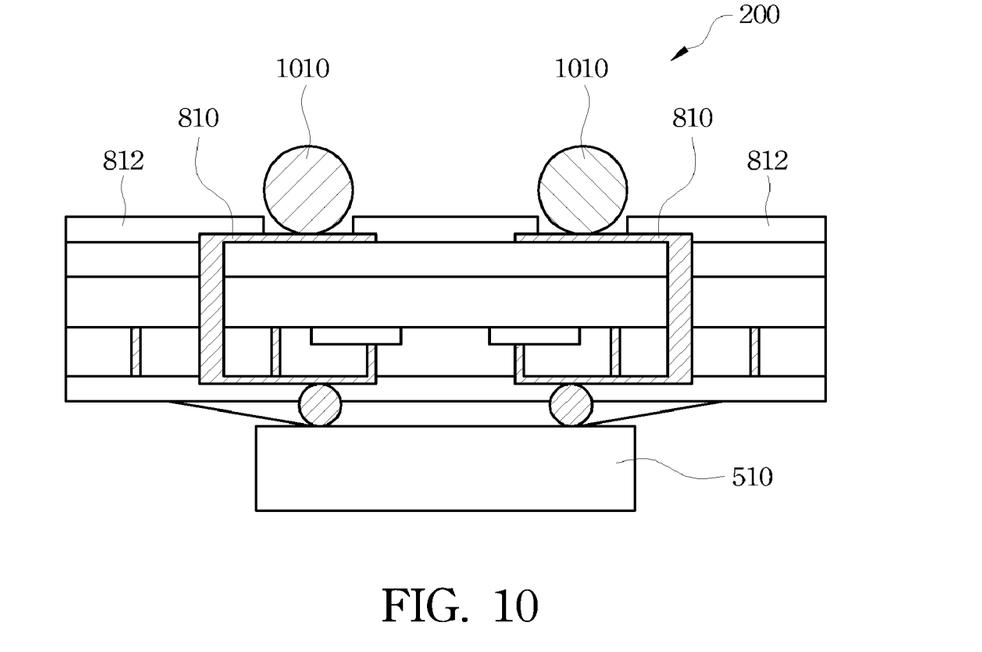

FIGS. 8-10 illustrate a second embodiment in which double-sided redistribution lines are used to allow for greater flexibility in a pin-out configuration in accordance with an embodiment of the present invention. FIG. 8 assumes a wafer 200 that has been formed in a manner similar to that discussed above with reference to FIGS. 1-3, wherein like reference numerals refer to like elements.

Accordingly, FIG. 8 illustrates wafer 200, which corresponds to wafer 100 of FIG. 3 after backside redistribution lines 810 and a solder mask 812 have been formed, in accordance with an embodiment of the present invention. The backside redistribution lines 810 may be formed in a similar manner and of similar materials as the redistribution lines 116 discussed above with reference to FIG. 1. Thereafter, the solder mask 812 may be formed in a similar manner as solder mask 610 discussed above with reference to FIG. 6.

FIG. 9 illustrates the second die 510 attached to the wafer 200 in accordance with an embodiment of the present invention. The second die 510 may be attached to the wafer 800 using solder balls 514 and underfill material 516 as described above with reference to FIG. 5. FIG. 10 illustrates formation of solder balls 1010 in accordance with an embodiment of the present invention.

Figure 11:
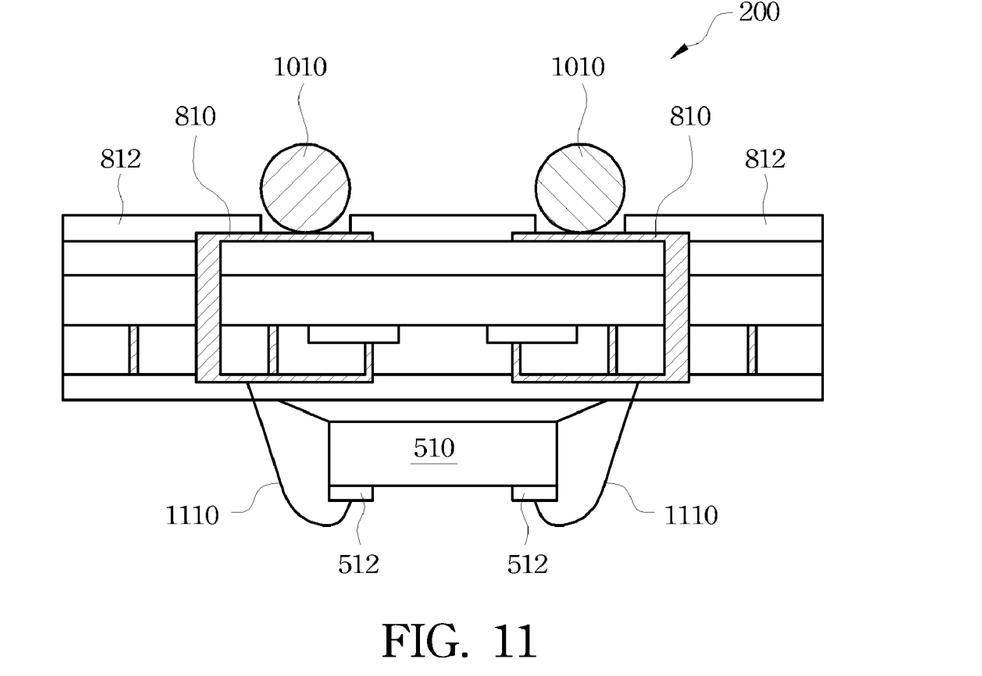
FIG. 11 illustrates another embodiment of a stacked die package in accordance with an embodiment of the present invention.

Other methods may also be used in this embodiment to electrically couple contact pads 512 on the second die 510 to the first redistribution lines 116. For example, FIG. 11 illustrates an embodiment in which the second die 510 of FIGS. 8-11 is electrically coupled to the first die 130 using wire bonds 1110 as are known in the art. In this embodiment, the second die 510 is attached to the first die 130 such that the contact pads 512 on the second die 510 face away from the first die 130. Wire bonds 1110 extend over the side of the first die and electrically couple the contact pads 512 to respective ones of the first set of redistribution lines 116.

One of ordinary skill in the art will realize that the embodiment illustrated in FIGS. 8-11 allow a greater level of flexibility than that allowed by the embodiment illustrated in FIGS. 1-7. In particular, the location of the solder balls in the embodiment illustrated in FIGS. 1-7 is restricted to the location of the through-silicon vias. Accordingly, a greater level of care must be taken in laying out the circuitry on the wafer to allow through-silicon vias at locations required for the pin-out design. On the other hand, the backside redistribution lines in the embodiment illustrated in FIGS. 8-11 allow a designer to redistribute the electrical lines as needed.

Figure 12:
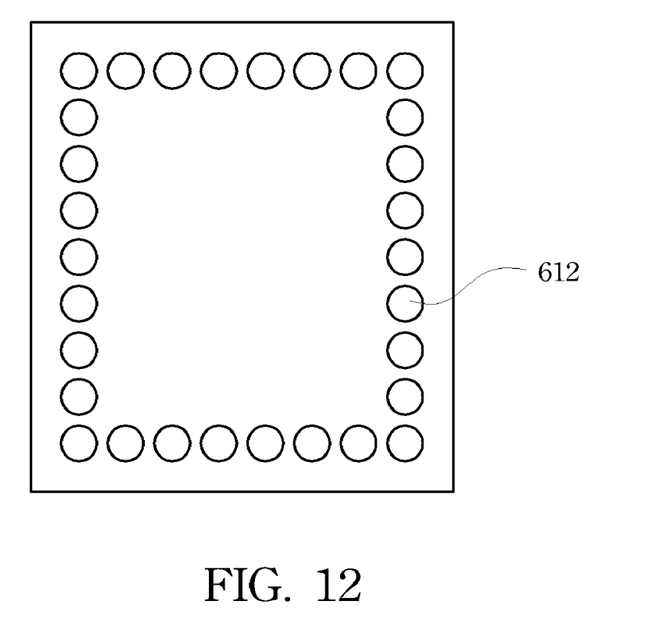
FIGS. 12-13 illustrate pin-out configurations that may be used with embodiments of the present invention.
Figure 13:
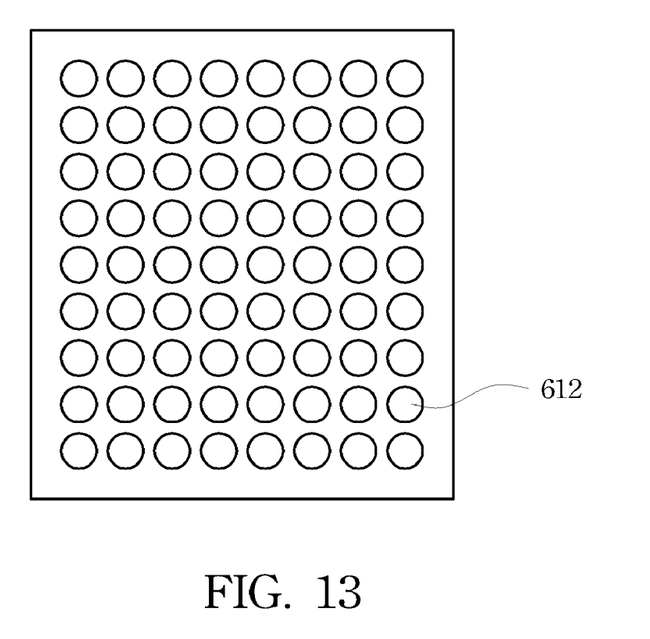

For example, it has been found that the embodiment of FIGS. 1-7 is useful with pin-out configurations such as that illustrated in FIG. 12 because of the relative ease of locating through-silicon vias along the peripheral region of the die. FIG. 13 illustrates a pin-out for which the embodiment illustrated in FIGS. 8-11 may be better suited because of the greater number and distribution of the solder balls. Other pin-out configurations may be used.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of packaging semiconductor dies, the method comprising:
providing a wafer having a first die, the first die having a protective layer formed thereon, the first die having semiconductor structures on a first side and the protective layer formed on a second side, the first side being an opposing side of the second side, the first die having vias formed through the first die and the protective layer, the first die further having first redistribution lines electrically coupling the semiconductor structures to the vias; and
attaching a second die to the first die, the second die facing the first side of the first die, contact pads of the second die being electrically coupled to respective ones of the first redistribution lines.

2. The method of claim 1, further comprising forming second redistribution lines on the second side of the first die, each of the second redistribution lines being electrically coupled to respective ones of the vias.

3. The method of claim 1, wherein the attaching is performed by orienting the second die such that the contact pads face the first die and electrically coupling the contact pads to the respective ones of the first redistribution lines with solder balls.

4. The method of claim 1, wherein the attaching is performed by orienting the second die such that the contact pads face away from the first die and electrically coupling the contact pads to the respective ones of the first redistribution lines with wire bonds.

5. The method of claim 1, wherein the providing the first die includes:
attaching a carrier wafer to the first die;
removing at least a portion of the second side of the first die, thereby causing the vias to protrude from the second side of the first die;
forming the protective layer over the second side of the first die, the vias being at least partially exposed; and
removing the carrier wafer.

6. The method of claim 5, further comprising forming second redistribution lines over the protective layer prior to the removing the carrier wafer, the second redistribution lines being electrically coupled to respective ones of the vias.

7. The method of claim 1, further comprising after the attaching dicing the wafer to singulate the first die.

8. A method of packaging semiconductor dies, the method comprising:
providing a first wafer having a first die thereon, the first die having a first substrate, the first substrate having semiconductor structures formed on a first surface, the first substrate having one or more dielectric layers and metal layers formed on the first surface, the first die further having deep conductive vias formed partially through the first substrate and first redistribution lines electrically coupling the semiconductor structures to respective ones of the deep conductive vias;
attaching a carrier wafer to the first wafer on a first side facing the first redistribution lines;
exposing at least a portion of the deep conductive vias on a second side of the first die such that the deep conductive vias protrude from the second side of the first die, the second side being an opposing side of the first side;
forming a protective layer over the first substrate between the deep conductive vias such that the deep conductive vias are exposed;
removing the carrier wafer; and
attaching a second die to the first die, the second die facing the first redistribution lines, contact pads of the second die being electrically coupled to respective ones of the first redistribution lines.

9. The method of claim 8, wherein the exposing is performed at least in part by grinding.

10. The method of claim 8, wherein the exposing is performed at least in part by etching.

11. The method of claim 8, wherein the attaching the second die is performed such that the contact pads of the second die face away from the first die and are electrically coupled to respective ones of the first redistribution lines via wire bonding.

12. The method of claim 8, wherein the attaching the second die is performed such that the contact pads of the second die face the first die and are electrically coupled to respective ones of the first redistribution lines via solder balls.

13. The method of claim 8, further comprising after the attaching the second die dicing the first wafer to singulate the first die.

14. A method of packaging semiconductor dies, the method comprising:
providing a first wafer having a first side and an opposing second side, the first wafer having a first plurality of dies;
attaching a carrier wafer to the first side of the first wafer;
removing at least a portion of the second side of the first wafer to cause through-silicon vias to protrude from a surface of the second side;
forming a protective layer over the second side of the first wafer between the protruding through-silicon vias, the through-silicon vias being at least partially exposed;
removing the carrier wafer; and
attaching a second plurality of dies to respective ones of the first plurality of dies, contact pads on each of the second plurality of dies being electrically coupled to respective ones of first redistribution lines on the first wafer, the first redistribution lines being electrically coupled to respective ones of the through-silicon vias.

15. The method of claim 14, wherein the attaching the second plurality of dies includes:
orienting each of the second plurality of dies over respective dies of the first wafer such that the contact pads of the second plurality of dies faces the first wafer; and
electrically coupling with solder balls the contact pads of the second plurality of dies to respective ones of first redistribution lines on the first wafer.

16. The method of claim 14, wherein the attaching the second plurality of dies includes:
orienting each of the second plurality of dies over respective dies of the first wafer such that the contact pads of the second plurality of dies faces away from the first wafer; and
electrically coupling with wire bonds the contact pads of the second plurality of dies to respective ones of first redistribution lines on the first wafer.

17. The method of claim 14, further comprising dicing the first wafer into singulated dies.

18. The method of claim 14, further comprising forming second redistribution lines over the protective layer.

19. The method of claim 18, further comprising forming solder balls on the second redistribution lines.

20. The method of claim 14, further comprising forming solder balls directly on exposed portions of the through-silicon vias.

* * * * *